United States Patent
Kim et al.

(10) Patent No.: US 7,057,242 B2
(45) Date of Patent: Jun. 6, 2006

(54) TRANSISTOR STRUCTURES HAVING ACCESS GATES WITH NARROWED CENTRAL PORTIONS

(75) Inventors: Ji-young Kim, Kyungki-do (KR); Hyoung-sub Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/264,136

(22) Filed: Oct. 3, 2002

(65) Prior Publication Data
US 2003/0107094 A1 Jun. 12, 2003

(30) Foreign Application Priority Data
Dec. 11, 2001 (KR) .............................. 2001-78284

(51) Int. Cl.
*H01L 29/76* (2006.01)
(52) U.S. Cl. ............... 257/401; 257/301; 257/303; 257/306; 257/296; 257/410; 257/510; 257/288; 257/390
(58) Field of Classification Search ............... 257/296, 257/301, 303, 306, 4.1, 410, 510, 288, 390, 257/401
See application file for complete search history.

(56) References Cited

U.S. PATENT DOCUMENTS

| | | | | |
|---|---|---|---|---|
| 5,732,009 A | * | 3/1998 | Tadaki et al. | 365/51 |
| 5,982,008 A | * | 11/1999 | Kajiyama | 257/401 |
| 6,168,904 B1 | * | 1/2001 | Cuthbert et al. | 430/312 |
| 6,246,080 B1 | * | 6/2001 | Takahashi et al. | 257/288 |
| 6,346,427 B1 | * | 2/2002 | Gardner et al. | 438/10 |
| 6,424,010 B1 | * | 7/2002 | Maeda et al. | 257/349 |
| 6,462,389 B1 | * | 10/2002 | Son et al. | 257/410 |

* cited by examiner

*Primary Examiner*—Eddie Lee
*Assistant Examiner*—Junghwa Im
(74) *Attorney, Agent, or Firm*—Myers Bigel Sibley & Sajovec PA

(57) ABSTRACT

An integrated circuit transistor includes an active region in a substrate, elongated along a first direction. A gate pattern is disposed on the substrate and crosses the active region along a second direction transverse to the first direction. The gate pattern includes an access gate portion disposed on the active region and narrowed at a central portion thereof. The gate pattern may further include a pass gate portion adjoining the access gate portion at the point beyond the edge of the active region, the pass gate portion having a lesser extent along the first direction than the access gate portion.

3 Claims, 5 Drawing Sheets

TRANSISTOR STRUCTURES HAVING ACCESS GATES WITH NARROWED CENTRAL PORTIONS

RELATED APPLICATION

This application claims priority to Korean Patent Application 2001-78284, filed on Dec. 11, 2001, the contents of which are herein incorporated by reference in their entirety.

BACKGROUND OF THE INVENTION

The present invention relates to integrated circuit devices, and more particularly, to transistor structures for integrated circuit devices.

As integrated circuits have been highly integrated, shallow trench isolation (STI) has replaced local oxidation of silicon (LOCOS) for isolating active regions, e.g., source and drain regions for transistors. However, the reduced area used for transistors can result in reduction of the threshold voltage Vth of the transistor. Such a phenomenon is called the "inverse narrow width effect," which is illustrated in FIG. 1.

Known causes of inverse narrow width effect include boron segregation and electric field crowding occurring at the edges of an active region defined by STI. FIG. 2 is a view of the layout of a gate pattern 7 formed across an active region 3 and FIG. 3 is a cross-sectional view of the gate pattern 7 of FIG. 1, taken along the lines III-III'. When a gate oxide layer 4 is regrown after STI regions 2 are formed in a substrate 1 to define an active region 3, boron ions 5, which have been doped on the substrate 1 to form a channel, are typically transferred to a gate oxide layer 4. As a result, the density of the boron ions 5 at edge regions E of the active region 3 may decrease, thereby lowering a threshold voltage of a transistor. This phenomenon is referred to as boron segregation.

When voltage is applied to the gate 7 to operate the transistor, an electric field is established in the gate oxide layer 4 in both horizontal and vertical directions due to the presence of recesses R in the STI region 2. This can lead to a concentrated electric field near the edge regions E, which can reduce the threshold voltage of the transistor. This is referred to as electric field crowding. As shown in curve a of FIG. 4, the threshold voltage of the edge region E (normalized to 100 in FIG. 1) may be reduced 20% due to boron segregation and electric field crowding.

Referring to FIG. 5, for a transistor of a highly integrated DRAM, portions 7a of gate lines referred to as "access gates" are disposed on an active region 3 and have a length E that is sufficient to operate the transistors. Other gate line portions 7b referred to as "pass gates" are formed on STI regions, and have a gate length L' sufficient to propagate signals. In an actual device, limitations of the photolithography process used to fabricate the device may cause the gate length at a region E to be significantly shorter than the gate length at a region C, as indicated by dashed lines in FIG. 5. As a result, as shown in curve b of FIG. 4, the threshold voltage of a transistor at the region E can be reduced as much as to 60% in comparison to the threshold voltage at the region C. This can result in undesirably large sub-threshold leakage currents, and can deteriorate the dynamic refresh characteristics of the DRAM.

SUMMARY OF THE INVENTION

According to some embodiments of the invention, an integrated circuit transistor includes an active region in a substrate, the active region elongated along a first direction. A gate pattern is disposed on the active region and extends across the active region along a second direction transverse to the first direction. The gate pattern has an extent along the first direction that is greater at a peripheral portion of the active region than at a center portion of the active region. In some embodiments of the present invention, the gate pattern linearly increases in extent along the first direction from the center portion of the active region towards the peripheral portion of the active region. In other embodiments of the present invention, the gate pattern exhibits a stepwise increase in extent along the first direction between the center portion of the active region and the peripheral portion of the active region. The gate pattern may increase in extent along the first direction from the center portion of the active region to a point beyond an edge of the active region at which the extent of the gate pattern along the first direction decreases.

In further embodiments of the invention, an integrated circuit transistor includes an active region in a substrate, elongated along a first direction. A gate pattern is disposed on the substrate and crosses the active region along a second direction transverse to the first direction. The gate pattern includes an access gate portion disposed on the active region and narrowed at a central portion thereof. The gate pattern may further include a pass gate portion adjoining the access gate portion at the point beyond the edge of the active region, the pass gate portion having a lesser extent along the first direction than the access gate portion.

In still further embodiments of the present invention, a transistor structure, e.g., a transistor pair, includes an active region in a substrate, the active region having first and second protrusions extending in opposite directions along a first axis. First and second gate patterns are disposed on the active region, crossing respective ones of the first and second protrusions along a second direction transverse to the first direction. The first and second gate patterns increase in extent along the first direction from center portions of the first and second protrusions towards peripheral portions of the first and second protrusions.

DETAILED DESCRIPTION

Figure 1:
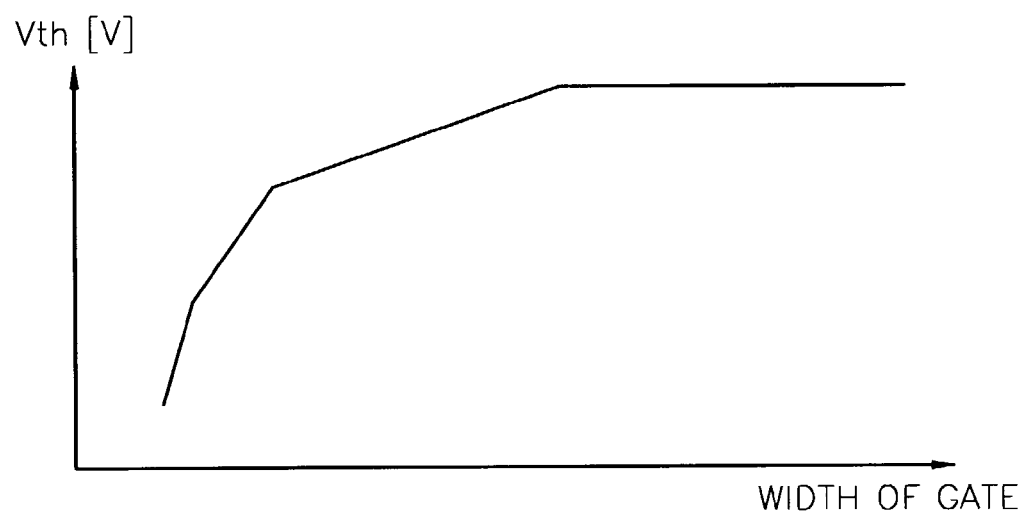
FIG. 1 is a graph showing relationships between transistor gate width and threshold voltage.
Figure 2:
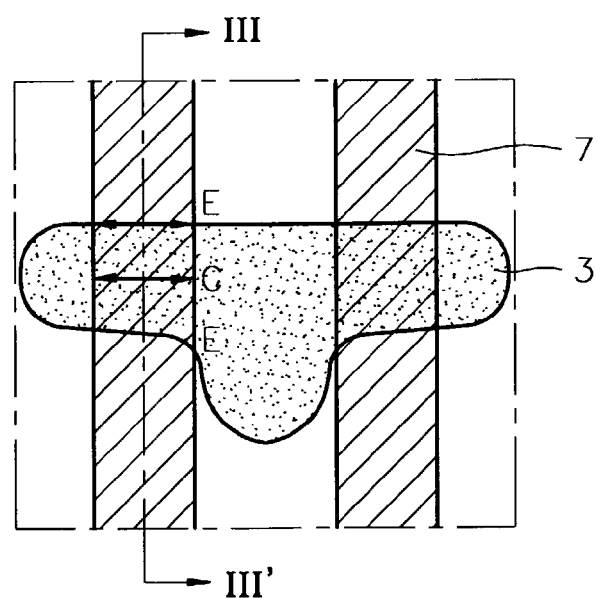
FIG. 2 is a plan view of the layout of a conventional cell transistor.
Figure 3:
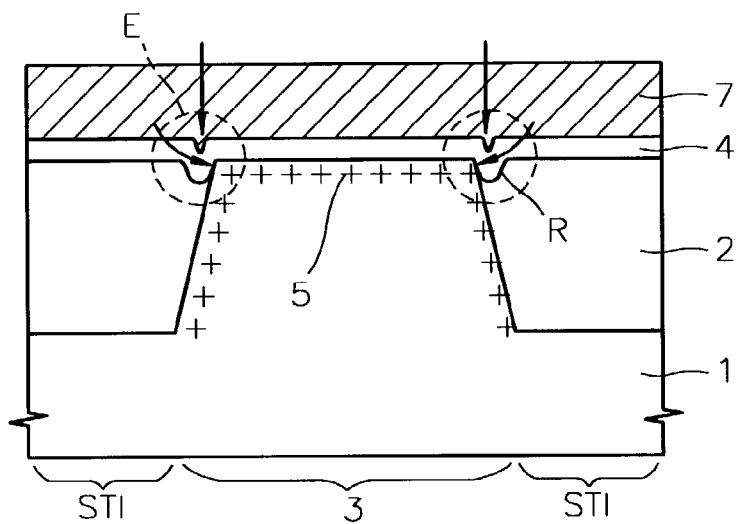
FIG. 3 is a cross-sectional view of the transistor of FIG. 2.
Figure 4:
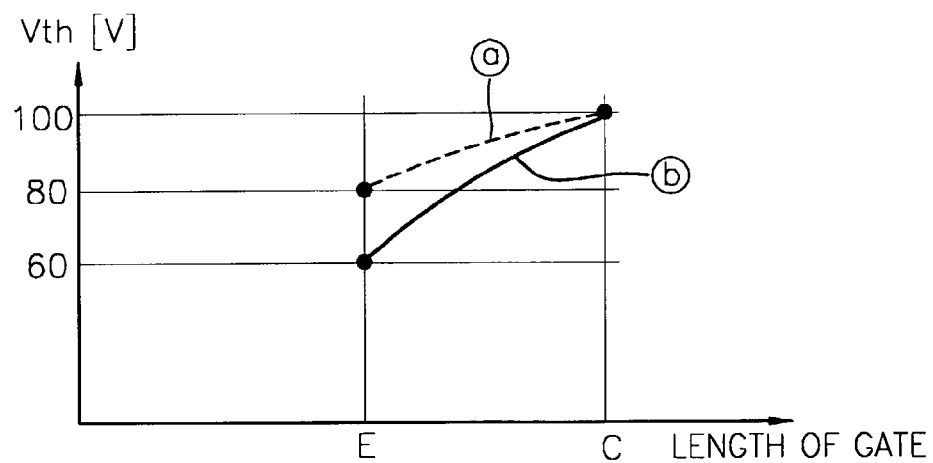
FIG. 4 is a graph showing relationships between gate length and threshold voltage.

The present invention now will be described more fully with reference to the accompanying drawings, in which embodiments of the invention are shown. These embodiments are provided so that this disclosure will be thorough and complete. In the drawings, the size of layers and regions may be exaggerated for clarity. It should be understood that when a structure is referred to as being "on" another structure, it may be directly on the other structure or intervening structures may also be present. Like reference numerals refer to like items.

Figure 6:
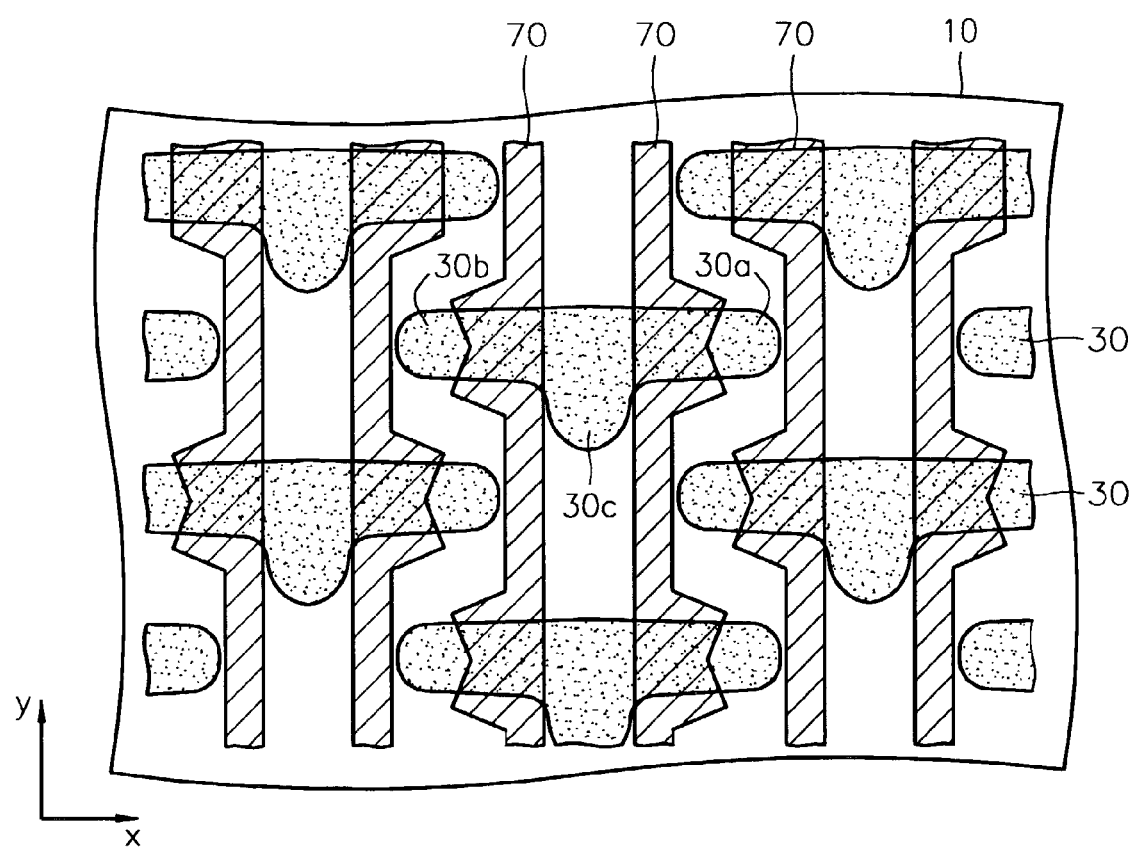
FIG. 6 is a plan view of cell transistors according to some embodiments of the present invention.

FIG. 6 illustrates a cell transistor layout according to some embodiments of the present invention. Reference numerals 30 and 70 denote active regions and gate patterns, respectively. The active regions 30 are defined by STI regions, and are arrayed in a substrate 10. The active region patterns 30 are elongated in an x direction, with first and second protrusions 30a, 30b that extend in opposite directions along the x direction. Third protrusions 30c extend along the y direction, and are configured to be connected to bit lines (not shown).

Figure 7:
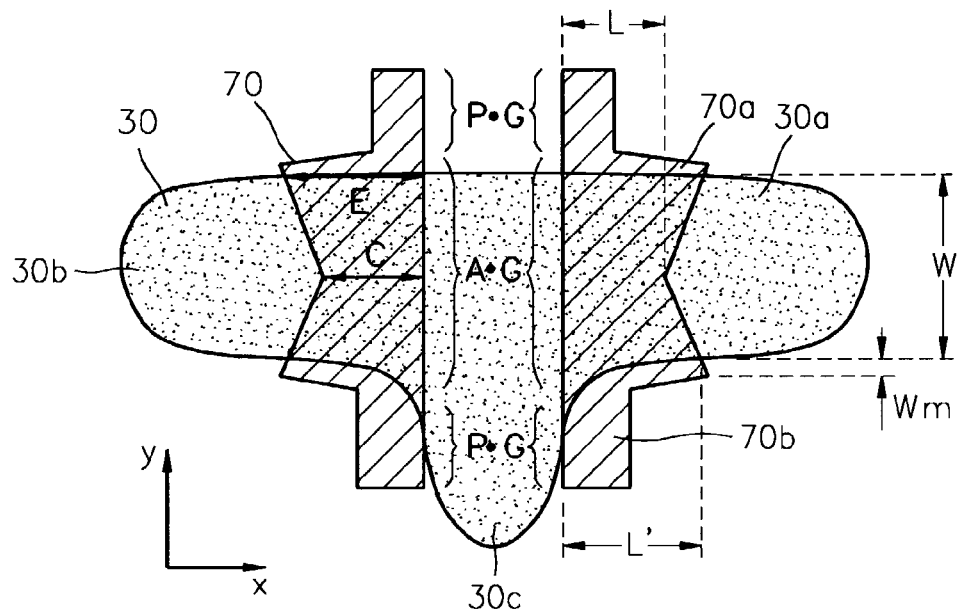
FIG. 7 is an enlarged view of a portion of FIG. 6.

The gate patterns 70 extend along a y direction, transverse to the x direction. Two gate patterns 70 cross each active region 30 in a substantially orthogonal fashion, such that each active region 30 can form two memory cells. Referring to FIG. 7, a gate pattern 70 includes an access gate (A.G.) portion 70a pass gate (P.G.) portions 70b. The access gate portion 70a is disposed on the active region 30. The pass gate portion 70b is, disposed on the STI region and has a smaller critical dimension (CD) than the access gate portion 70a.

As shown, the access gate portion 70a increases in extent along the x direction (or "length") from a center portion C of the active region 30 toward peripheral portions E of the active region 30. Preferably, the relationship between the length L of the access gate portion 70a at the center portion C of the active region 30 and the length L' of the access gate portion 70a at the peripheral portion E of the active region 30 is as follows:

$$1 < L'/L \leq 1.2 \qquad (1)$$

In an actual device, if the relationship between the lengths L and L' is as shown in equation (1), the length of the access gate 70a near the edges of the active region 30 may be the same or longer than the length of the access gate 70a near the center portion C of the active region 30.

Preferably, the access gate portion 70a extends along the y direction such that a portion of the access gate portion 70a extends onto the STI region. Preferably, the extent along the y direction (or "width") Wm of the extended portion is less than 25% of the width W of the active region 30. For instance, if the width W is less than about 200 nm, it is preferable that the extent Wm of the extended portion is less than about 50 nm.

Figure 5:
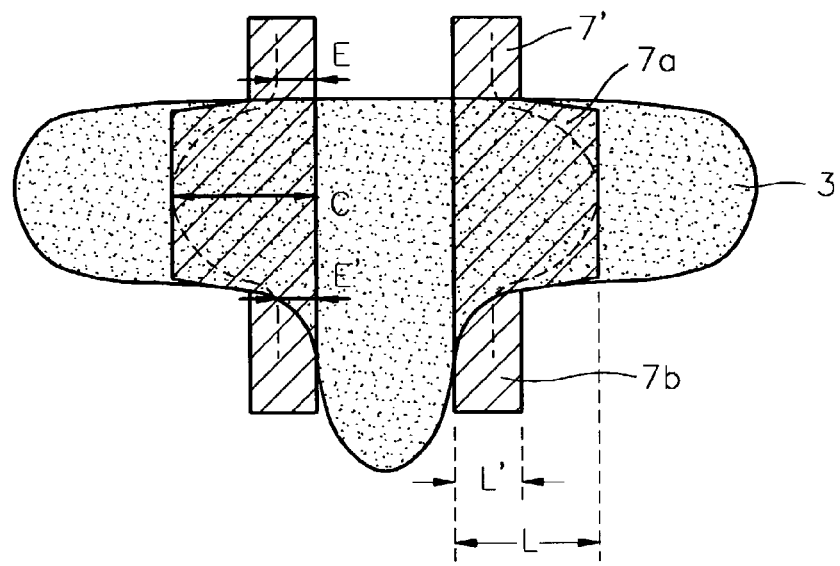
FIG. 5 is a view of the layout of another conventional cell transistor.
Figure 8:
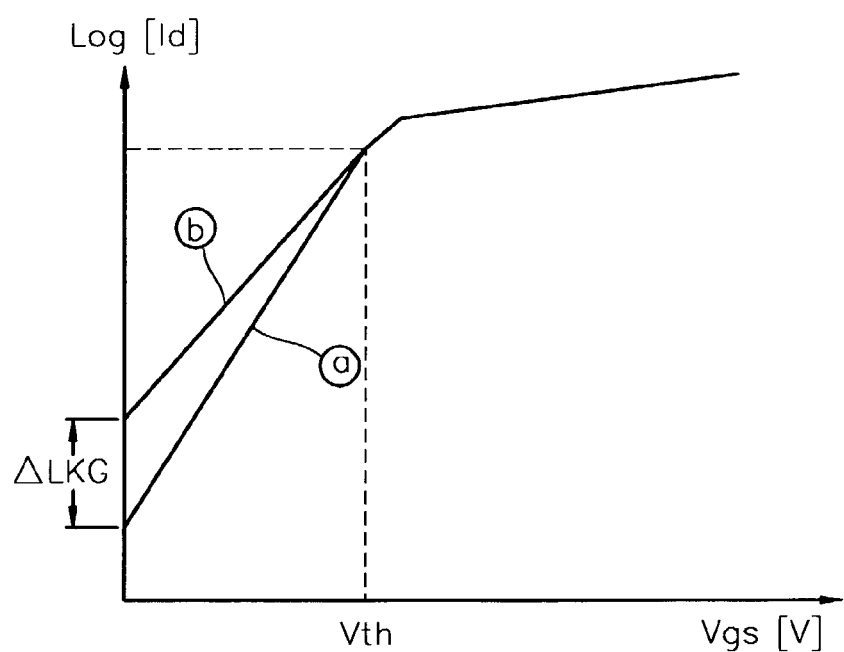
FIG. 8 is a graph showing I–V characteristics of a cell transistor according to some embodiments of the present invention in comparison to characteristics of a conventional cell transistor.

FIG. 8 is a graph showing I–V characteristics of a cell transistor according to some embodiments of the present invention. In particular, curve a represents a relationship between the gate to source voltage (Vgs) and drain current (Id) of a cell transistor according to embodiments of the invention having an access gate portion that is 0.33 μm long at its center. Curve b represents a relationship between the Vgs and Id of a conventional cell transistor that has an access gate whose center is 0.33 μm long, but is fabricated with the conventional configuration shown in FIG. 5. From FIG. 8, it may be noted that, although a threshold voltage Vth of the cell transistor according to embodiments of the present invention is comparable to that of the conventional cell transistor, sub-threshold leakage currents of the cell transistor according to the present invention can be reduced by an amount ΔLKG in comparison to the conventional cell transistor.

Figure 9:
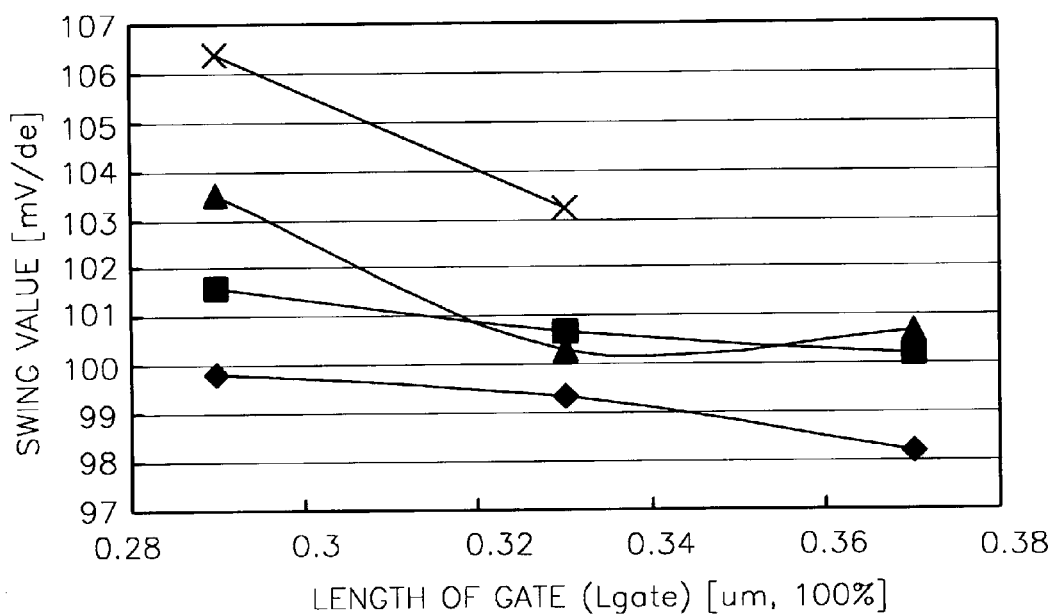
FIG. 9 is a graph showing sub-threshold swing characteristics of a cell transistor according embodiments of the present invention in comparison to characteristics of a conventional cell transistor.

FIG. 9 is a graph showing sub-threshold swing characteristics of cell transistors according to embodiments of the present invention in comparison to conventional cell transistors. Cell transistors according to the present invention have been fabricated with the configuration illustrated in FIGS. 6 and 7 with access gates whose centers are 0.29, 0.33 and 0.37 μm long, respectively. The symbols -♦- and -■- denote swing values of some cell transistors according to some embodiments of the present invention, and -▲- and -x- denote swing values of conventional cell transistors with comparable access gate lengths.

The swing values are measured in units of mV/decade, corresponding to 1/slope of the graph of FIG. 8. Generally speaking, the smaller the swing value is, the better the performance of a cell transistor. Swing value S can be expressed as follows:

$$S = \Delta Vg/\Delta \log Id \qquad (2)$$

The graph of FIG. 9 reveals that the swing values of transistors according to the present invention can be much smaller than those of conventional transistors of comparable access gate center length. Generally speaking, the shorter the access gate center length of the transistor, the smaller the swing value of the transistor.

Figure 10:
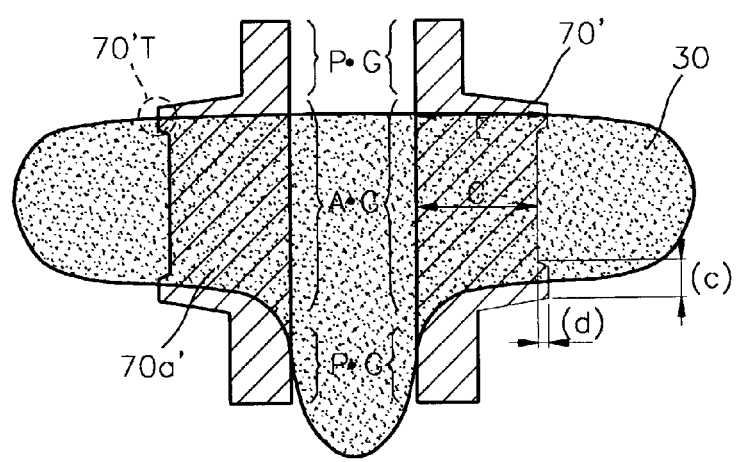
FIG. 10 is a plan view of cell transistors according to further embodiments of the present invention.

FIG. 10 is a view of the cell transistor layout according to further embodiments of the present invention. Tabs 70'T are formed near positions at which access gate portions 70'a of gate patterns 70' cross edge portions E of an active region 30. The length of the access gate portions 70'a at these positions E is greater than near the center portion C of the active region 30, and increases in a stepwise fashion at the tabs 70'T.

The tabs 70'T may be sized based on margins required during photolithography processes used to fabricate the device. Preferably, the extent d of the tab patterns 70'T along the x direction is less than about 20% of the length C of the access gate at the center portion of the active region 30, and the extent c along the y direction is less than about 25% of the width W of the active region 30. For instance, if the length C is less than 0.5 μm, the extent d of the tab pattern 70'T is preferably less than 100 nm, and if the width W is less than 200 nm, the extent c of the tab pattern 70'T is preferably less than 50 nm.

In the drawings and specification, there have been disclosed typical embodiments of the invention. Although specific terms are employed, they are used in a generic and descriptive sense only and not for purposes of limitation.

That which is claimed is:

1. A integrated circuit transistor, comprising:
   an active region in a substrate, the active region elongated along a first direction; and
   a gate pattern on the substrate and crossing the active region along a second direction transverse to the first direction, the gate pattern comprising an access gate portion disposed on the active region and narrowed at a central portion thereof, wherein the access gate portion linearly increases in width along the first direction from a center portion of the active region towards a point beyond where the gate pattern crosses the edge of the active region.

2. A transistor according to claim 1, wherein the gate pattern further comprises a pass gate portion adjoining the access gate portion at the point beyond where the gate pattern crosses the edge of the active region, and wherein the pass gate portion has lesser width along the first direction than the access gate portion.

3. A transistor according to claim 1, wherein the extent of the active region along the second direction wherein the access gate crosses the active region is less than about 200 nm.

* * * * *